(12) United States Patent
Hirosue et al.

(10) Patent No.: US 6,504,581 B1
(45) Date of Patent: Jan. 7, 2003

(54) LIQUID CRYSTAL DISPLAY APPARATUS AND MANUFACTURING METHOD THEREOF

(75) Inventors: Miyuki Hirosue, Kikuchi-gun (JP); Naoki Nakagawa, Kikuchi-gun (JP); Hironori Aoki, Kikuchi-gun (JP)

(73) Assignee: Advanced Display Inc., Kikuchi-gun (JP)

(*) Notice: Subject to any disclaimer, the term of this patent is extended or adjusted under 35 U.S.C. 154(b) by 0 days.

(21) Appl. No.: 09/318,726

(22) Filed: May 26, 1999

(30) Foreign Application Priority Data

Dec. 18, 1998 (JP) .......................... 10-360607

(51) Int. Cl.⁷ .................. G02F 1/13; G02F 1/1335; G03F 7/00
(52) U.S. Cl. ............................... 349/4; 349/1
(58) Field of Search .................. 349/42, 4, 139, 349/1; 430/312

(56) References Cited

U.S. PATENT DOCUMENTS 6,030,265 A * 2/2000 Inada ..................... 445/24
6,291,136 B1 * 9/2001 Masutani et al. ............ 430/312

FOREIGN PATENT DOCUMENTS

| JP | 2-50130 | 2/1990 |
| JP | 3-148636 | 6/1991 |
| JP | 6-324474 | 11/1994 |
| JP | 8-122768 | 5/1996 |

* cited by examiner

Primary Examiner—William L. Sikes
Assistant Examiner—Dung Nguyen
(74) Attorney, Agent, or Firm—Oblon, Spivak, McClelland, Maier & Neustadt, P.C.

(57) ABSTRACT

Method for manufacturing a liquid crystal display apparatus including: a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and a counter substrate provided with a liquid crystal interposed between the TFT array substrate and the counter substrate; wherein a divisional exposing method is adopted as a patterning method on the TFT array substrate, so that adjacent exposing areas within a display area of the liquid crystal display apparatus have overlapped portions with each other, and so that a shot layout is defined in such a manner that, within the overlapped exposing areas; wherein the portion which comes closer to a predetermined shot area is subjected to a greater distribution of the shot.

11 Claims, 10 Drawing Sheets

LIQUID CRYSTAL DISPLAY APPARATUS AND MANUFACTURING METHOD THEREOF

BACKGROUND OF THE INVENTION

The present invention relates to a liquid crystal display apparatus of an active matrix system wherein a number of TFT (thin film transistors) are arranged together with pixel electrodes, and a manufacturing method thereof.

With respect to patterning methods for a TFT array substrate for a liquid crystal display apparatus using TFTs, two methods are mainly used:

one is a batch exposing method in which, by using a conventional large-size mask, an exposing process is applied at one time to a display area constituting the liquid crystal display apparatus and a panel peripheral portion including a wiring portion for transmitting scanning signals and data signals to the display area from external circuits or a transfer pad for applying a voltage to a counter substrate; and the other is a divisional exposing method in which the display area and the panel peripheral portion, which are divided into a plurality of small masks, are exposed while they are repeatedly shifted on the array substrate.

The main feature of the batch exposing method is that no border line appears on the pattern on the array substrate since an electron beam or a laser beam is used so as to directly draw patterns in the pattern drawing method upon manufacturing the large-size mask; however, the disadvantages of this method are that the mask is very expensive and that the pattern is not changed easily. In contrast, the division exposing method, which uses inexpensive masks as compared with the batch exposing method and allows easy alternation of the pattern, have been widely used; however, the disadvantage of this method is that a plurality of border lines appear on the display area due to the divided masks.

As described above, in the division exposing method, since a plurality of border lines appear on the display area, fine differences in the finishing precision of patterns on both of the sides of the border lines give adverse effects on the display characteristic, with the result that the differences in luminance on the borders become conspicuous, and are visually recognized as so-called shot unevenness. Moreover, recently, as the liquid crystal display apparatuses have been improved to have high quality and high precision, variations in the aperture ratio, the occurrence of domains and dispersions in the gradation setting at the time of assembling the panel into the module due to fine process dispersions, which have conventionally not raised any problems, now raise the problem of emphasizing the shot unevenness. Here, it is well known that, although the visibility of the human eye is very high in recognizing regular pattern layouts and differences in luminance, it is relatively low in the recognition of patterns that gradually change over a wide range. Therefore, the object of the present invention is to improve the quality of the liquid crystal display apparatus by making the display unevenness less conspicuous by utilizing the vagueness of the visibility of the human eye, and to widen the margin of the process by absorbing process dispersions, without causing a reduction in the yield of processing products.

The manufacturing method of a liquid crystal display apparatus in accordance with claim 1 of the present invention, which is used in a liquid crystal display apparatus including:

(1) a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and (2) a counter substrate provided with a liquid crystal interposed between the TFT array substrate and the counter substrate;

wherein a divisional exposing method is adopted as a patterning method on the TFT array substrate, so that adjacent exposing areas within a display area of the liquid crystal display apparatus have overlapped portions with each other being divided into a plurality shots, and so that a shot layout is defined in such a manner that, within the overlapped exposing areas; wherein the portion which comes closer to a predetermined shot area is subjected to a greater distribution of the predetermined shot.

The manufacturing method of a liquid crystal display apparatus in accordance with claim 2 of the present invention, which is used in a liquid crystal display apparatus including:

(1) a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and (2) a counter substrate provided with a liquid crystal interposed between the TFT array substrate and the counter substrate;

wherein a divisional exposing method is adopted as a patterning method on the TFT array substrate, so that adjacent exposing areas within a display area of the liquid crystal display apparatus have overlapped portions with each other being divided into a plurality shots, wherein a shot layout is defined in such manner that, within the exposing areas having quadruple overlaps; wherein the portion which comes closer to a predetermined shot area is subjected to a greater distribution of the predetermined shot.

The manufacturing method of a liquid crystal display apparatus in accordance with claim 3 of the present invention is arranged so that, within the overlapped exposing areas, the shot is selected by using a pixel size as one unit.

The manufacturing method of a liquid crystal display apparatus in accordance with claim 4 of the present invention is arranged so that, within the overlapped exposing areas, the shot is selected by using random numbers.

The manufacturing method of a liquid crystal display apparatus in accordance with claim 5 of the present invention is arranged so that, within the overlapped exposing areas, the ratio occupied by a predetermined shot is selected in proportion to the distance from the border between one of the predetermined area and the other area of a different shot.

The manufacturing method of a liquid crystal display apparatus in accordance with claim 6 of the present invention is arranged so that the overlapped exposing areas have a width greater than 4 mm.

The manufacturing method of a liquid crystal display apparatus in accordance with claim 7 of the present invention is arranged so that, within the overlapped exposing areas, a shot adjacent to a different shot is allowed to have a multi-exposure area of 1 to 5 μm.

The manufacturing method of a liquid crystal display apparatus in accordance with claim 8 of the present invention is applied as a patterning method to any one of steps of forming the scanning-line, forming the semiconductor-layer, forming the data-line and forming the pixel-electrode.

The manufacturing method of a liquid crystal display apparatus in accordance with claim 9 of the present invention is applied to a plurality of steps among the steps of forming scanning-line, forming the semiconductor-layer, forming the data-line and forming the pixel-electrode, wherein the same shot layout is used within the overlapped areas among the above-mentioned applied steps.

The manufacturing method of a liquid crystal display apparatus in accordance with claim 10 of the present invention is applied to a plurality of steps among the steps of forming scanning-line, forming the semiconductor-layer, forming the data-line and forming the pixel-electrode, wherein individually independent shot layouts are used within the overlapped exposing areas among the above-mentioned applied steps.

The liquid crystal display apparatus in accordance with claim 11 of the present invention is manufactured by using the method of claim 1.

In other words, the present invention, which uses the division exposing method, allows the visibility to luminance differences to become vague by preventing apparent border lines from being formed within the display area. More specifically, a plurality of adjacent shots are allowed to have overlapped areas, each having not less than a predetermined width, with each other, and the overlapped areas are exposed by any one of shots, with the shots other than the selected shot being light-shielded by light-shielding patterns on the mask, thereby making it possible to prevent duplicate shots. Moreover, in order to allow the human visibility to the border portion to become further vague, it is effective to carry out the selection of shots within the overlapped areas by using random numbers.

An idea similar to the present invention has been proposed by Dainippon Insatsu K.K. as a method for manufacturing a large-size mask (see Japanese Unexamined Patent Publication No. 143513/1990, Japanese Unexamined Patent Publication No. 143514/31990 and Japanese Unexamined Patent Publication No. 144535/1990.) This method was used as a patterning method for exposing a large-size mask substrate by combining a plurality of small-size masks in those days when a conventional direct drawing method using an electron beam, a laser beam, etc. could not be applied to the large area of a large-size mask. Here, in the case when this method is used in a large-mask manufacturing pattern, although it is possible to make less conspicuous the border lines due to differences in finished shapes on the large mask, the positional relationship between patterns on the large-size mask is always the same. Therefore, an array pattern, manufactured by a large-size mask using this method, always contains errors in the processed state at the time of the large-size mask formation, and even if these errors are not preferable for the electrical characteristics, the relationship cannot be changed. In contrast, in the case when this method is applied to the division exposing system, since a correction can be made for each shot, it is possible to improve the electrical characteristics by adjusting the fine positional relationship between adjacent shots. The present invention develops this idea as a manufacturing method for TFT array substrates, and solves problems encountered in actually applying the idea to the manufacturing method for TFT array substrates.

Figure 1:
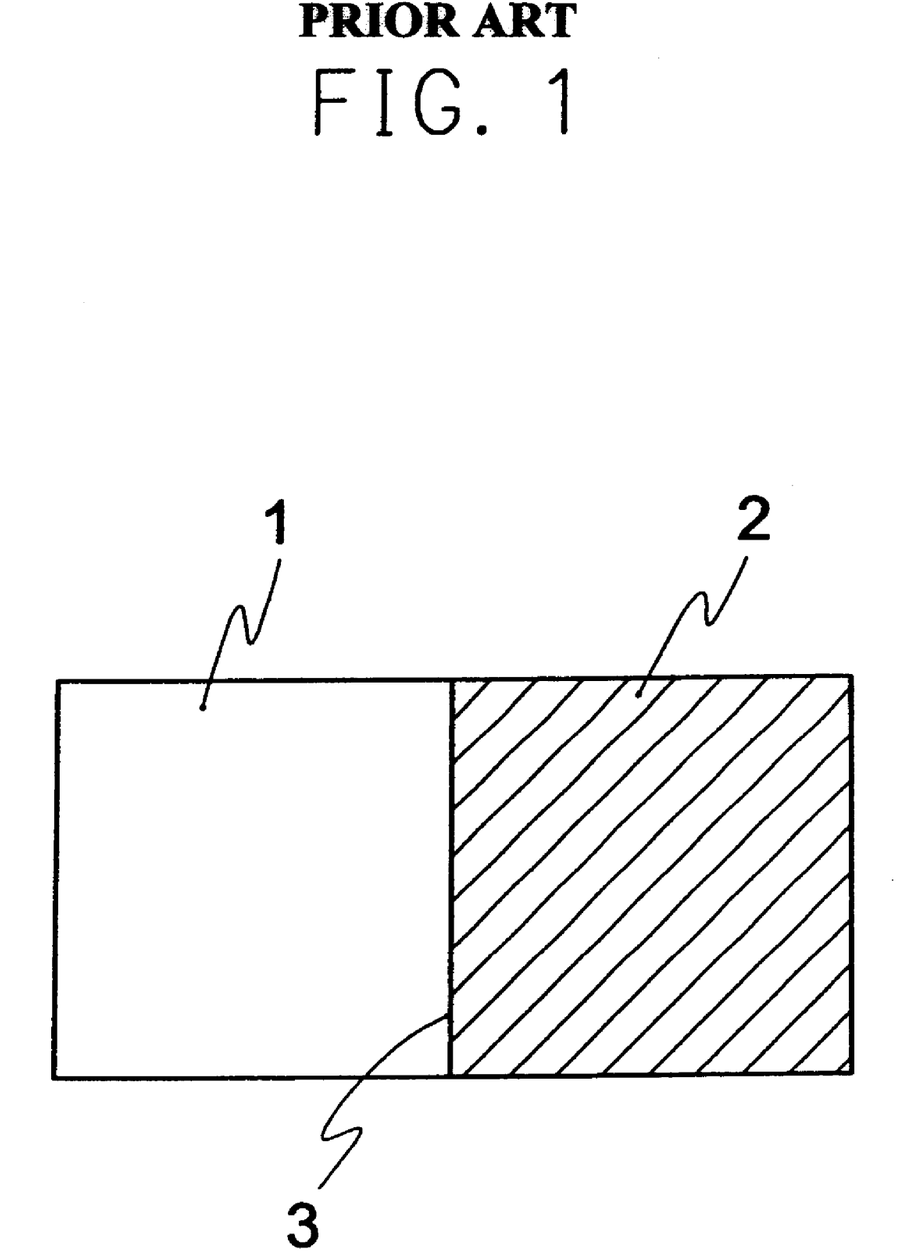
FIG. 1 is a schematic plan view showing a shot border portion in the case when a conventional division exposing system is used.

One of the features of the present invention is that a process to which the present invention is applied can be freely selected. In other words, in a liquid crystal display apparatus in which the present invention is used, a process which is likely to cause shot unevenness due to its array structure and driving system may be predicted, and the present invention is applied only to such a process, while the other processes are carried out in such a manner as to leave apparent border lines as in the conventional method. In contrast, by applying the present invention to a plurality of processes so as to provide a plurality of parameters to the shot unevenness, it is possible to make the luminance differences less conspicuous. Moreover, in the case of adjacent different shots, a duplicate exposing area is formed along the border so that it is possible to prevent formation of unwanted patterns and loss of necessary patterns due to dispersions in the positional precision in the exposing device and the mask. The following description will discuss functions of the present invention. For convenience of explanation, an explanation will be given of a case in which the present invention is applied only to one process. FIG. 1 is a schematic plan view showing a shot border portion in the case when a conventional division exposing system is used.

In FIG. 1, reference numeral 1 shows one of adjacent shots 1; reference numeral 2 is another of adjacent shots; and reference numeral 3 shows a border line between adjacent shot 1 and shot 2. Since 1 and 2 have no overlapping areas, an apparent border as shown by reference numeral 3 is formed; thus, parameters with respect to the display characteristics tend to vary between the right side and the left side of the border 3 due to dispersions in the mask precision and the process finishing.

Figure 2A:
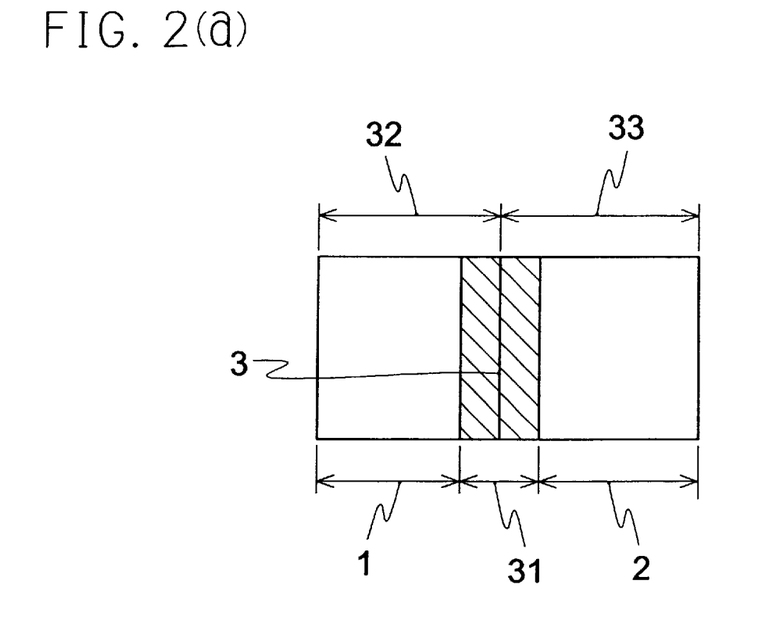
Figure 2B:
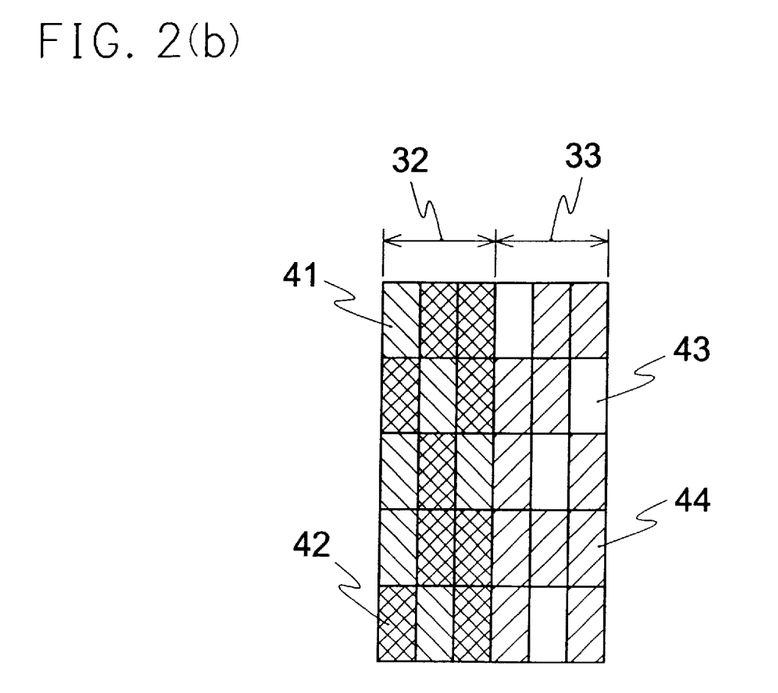

FIG. 2(a) is a schematic plan view showing the present invention. In FIG. 2(a), reference numeral 1 shows one of adjacent shots 1, reference numeral 2 shows another of the adjacent shots 2, reference numeral 31 shows an overlapped area between the shot 1 and shot 2. As indicated by reference numeral 31, each of shot 1 and shot 2 has an overlapped area of not less than a predetermined width, and has no apparent border. Reference numeral 32 shows an area in which a process other than the applied process (hereinafter, referred to as the other process) belongs to shot 1, and reference numeral 33 shows an area in which the other process belongs to shot 2. Moreover, in order to explain functions of the present invention more clearly, the overlapped area 31 is shown in FIG. 2(b) in an enlarged manner. In FIG. 2(b), reference numeral 41 shows an area in which the other process belongs to shot 1 and the applied process belongs to shot 1, and reference numeral 42 shows the other process belongs to shot 1 and the applied process belongs to shot 2. In the same manner, reference numeral 43 shows an area in which the other process belongs to shot 2 and the applied process belongs to shot 1, and reference numeral 44 shows an area in which the other process belongs to shot 2 and the applied process belongs to shot 2. As described above, even when the applied process of the present invention is limited to one process, four combinations of shots between the applied process and the other process exist within the overlapped area, and as shown in FIG. 2(b), four parameters, which give effects on the display characteristics, are randomly placed without having apparent borders, thereby making the luminance differences less conspicuous.

BRIEF DESCRIPTION OF THE DRAWINGS

FIG. 2(*a*) is a schematic plan view showing the present invention;

FIG. 2(*b*) is a plan explanatory view showing the overlapped area in FIG. 2(*b*);

DETAILED DESCRIPTION

The following description will discuss embodiments of the present invention in more detail.

Embodiment 1

Figure 3:
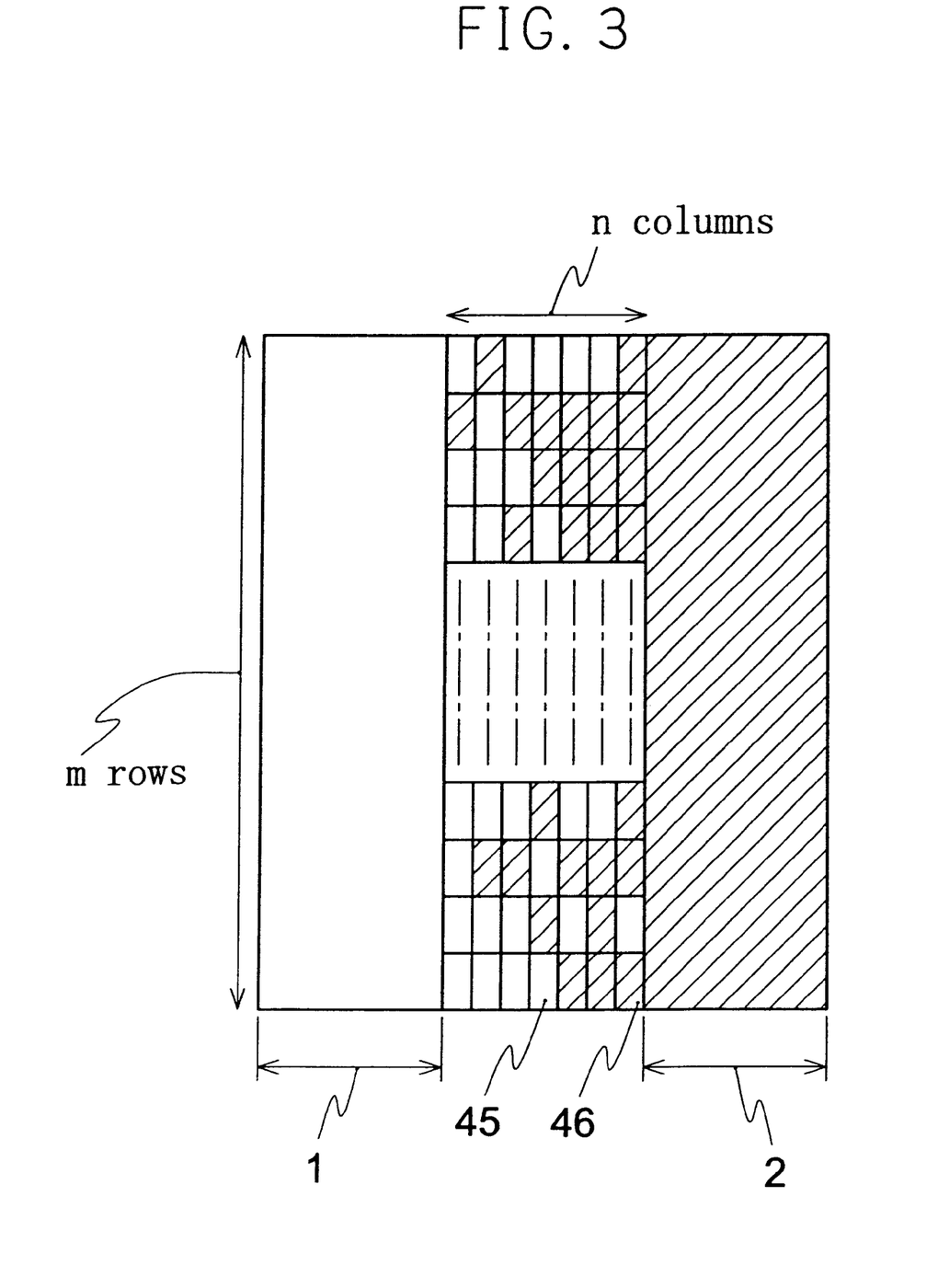
FIG. 3 is a schematic plan view showing a shot layout of a TFT array substrate related to one step in accordance with EMBODIMENT 1.
Figure 4:
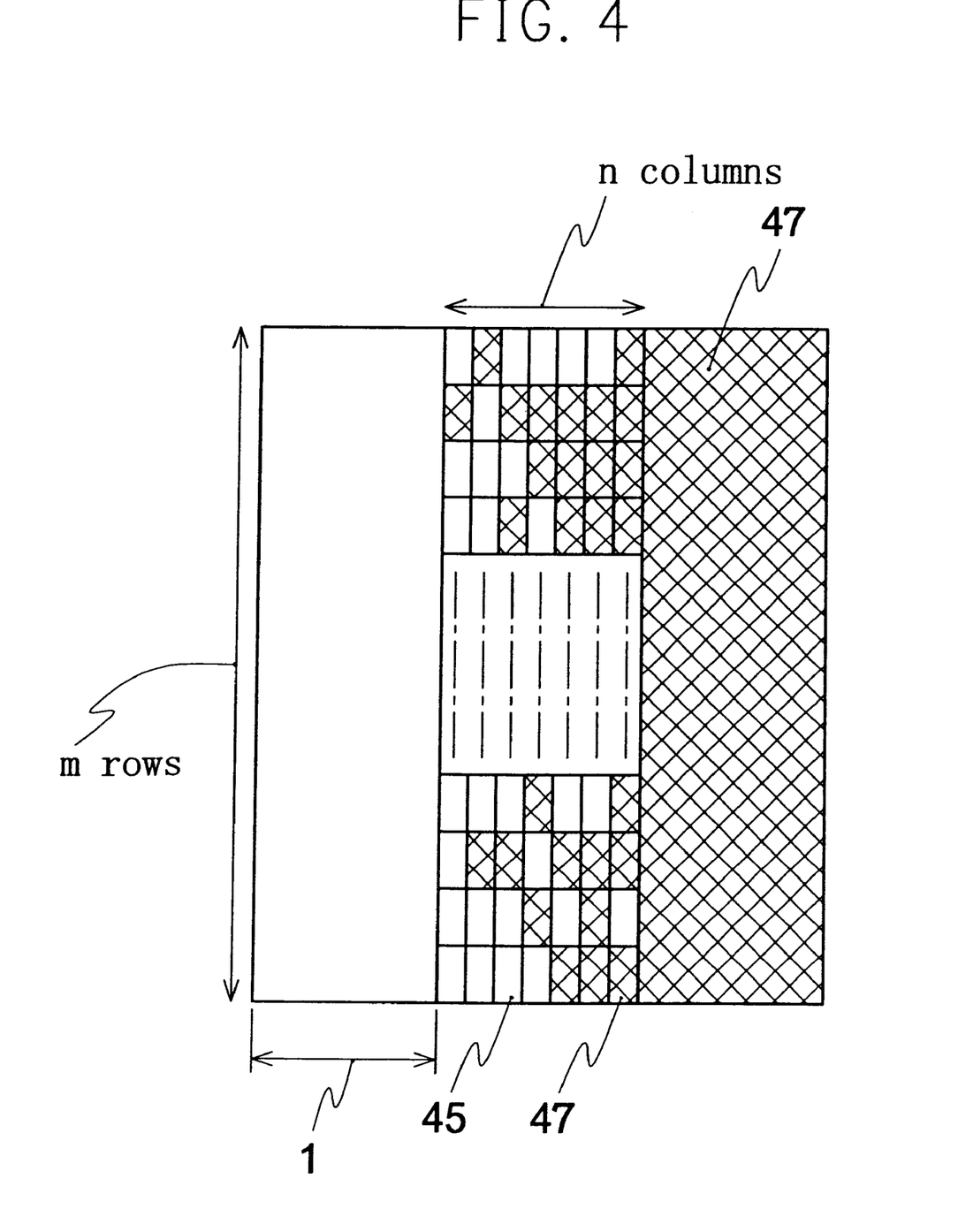
FIG. 4 is a schematic plan view showing a portion of a mask which is necessary for the shot layout of FIG. 3 in accordance with the present invention.
Figure 5:
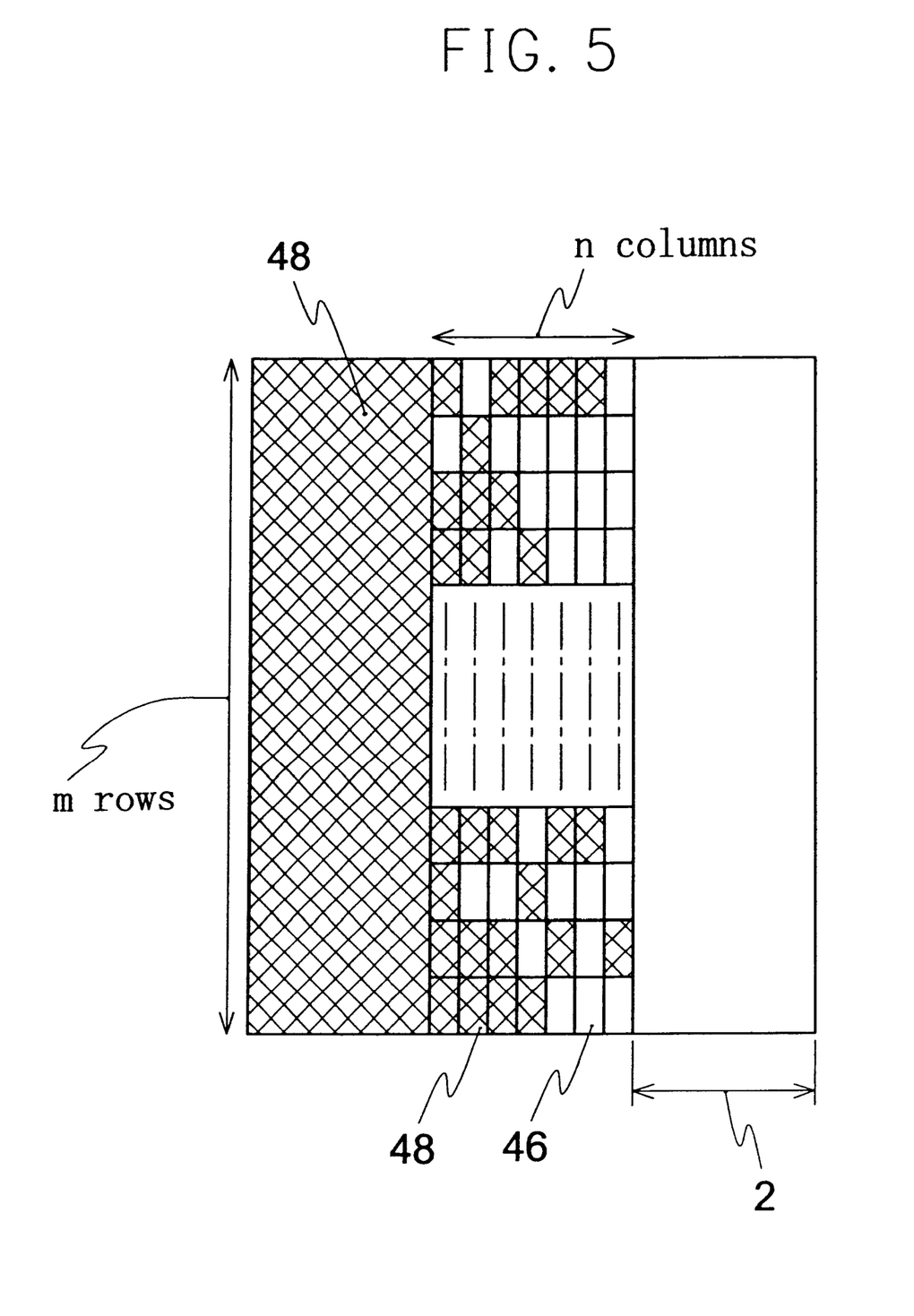
FIG. 5 is a schematic plan view showing a portion of a mask which is necessary for the shot layout of FIG. 3 in accordance with the present invention.

FIG. 3 is a schematic plan view that shows a shot layout of a TFT array substrate related to one step in accordance with the present embodiment of the invention, and FIGS. 4 and 5 show a schematic plan view showing masks required for the arrangement of FIG. 3. Overlapped areas between shot 1 and shot 2 adjacent to each other in the lateral direction are constituted by m rows and n columns by using a pixel size shot as one unit. Here, it is preferable to set the width (n columns) of the overlapped area greater than 4 mm so as to allow the visibility to become vague.

In FIG. 3, reference numeral 1 shows an area to be exposed only by shot 1, and reference numeral 2 shows an area to be exposed only by shot 2. Reference numeral 45 shows an area within the overlapped areas that is to be exposed by shot 1, and reference numeral 46 shows an area within the overlapped areas that is to be exposed by shot 2. With respect to the shot layout within the overlapped areas of m rows and n columns, as a portion in question comes closer to area 1 to be exposed only by shot 1, it contains more selected pixels 45 to be exposed by shot 1, and these are placed by using random numbers. For example, in a column adjacent to area 1 to be exposed only by shot 1 within the overlapped areas, pixels the number of which is represented by an integer (Mn) closest to m×n/(n+1) are selected as the pixels 45 that are to be exposed by shot 1. In a column adjacent thereto, the number is represented by integer (Mn−1) closest to m×(n−1)/(n+1), and so on; thus, the number of the pixels 45 to be exposed by shot 1 is successively reduced, and in a column adjacent to area 2 that is to be exposed only by shot 2, pixels the number of which is represented by an integer (M1) closest to m×1/(n+1) are selected as those to be exposed by shot 1. In the reversed manner, in the column closest to area 1 within the overlapped areas that is to be exposed only by shot 1, the number of pixels 46 that are to be exposed by shot 2 is represented by m−Mn, and as a portion in question comes closer to area 2 to be exposed only by shot 2, the number is increased, and in the column closest to area 2 to be exposed only by shot 2, the number is represented by m−M1.

In other words, the ratio of shot 1 within the overlapped areas increases in proportion to the distance from the border to area 2 exposed only by shot 2, while the ratio of shot 2 increases in proportion to the distance from the border to area 1 exposed only by shot 1, and within the columns, the shot selection related to each pixel is determined based on the above-mentioned ratio by using random numbers. With this arrangement, even if shot 1 and shot 2 have a difference in luminance that is visible by the human eye as their own parameters, the difference is not visually recognized as an apparent border, and since the luminance gradually varies in accordance with the ratio occupied by the selected pixels, it is possible to make the border vague and less conspicuous.

FIG. 4 is a schematic plan view that shows a portion related to the present invention of a mask 1 used upon exposure with shot 1. In FIG. 4, reference numeral 1 shows an area to be exposed only by shot 1, and reference numeral 45 shows an area that is to be exposed by shot 1 within the overlapped areas. Reference numeral 47 shows a light-shielding pattern of the mask 1 with respect to shot 1 within the overlapped areas and the adjacent areas. In the same manner, FIG. 5 is a schematic plan view that shows a portion related to the present invention of a mask 2 used upon exposure with shot 2. In FIG. 5, reference numeral 2 shows an area to be exposed only by shot 2, and reference numeral 46 shows an area that is to be exposed by shot 2 within the overlapped areas. Reference numeral 48 shows a light-shielding pattern of the mask 2 with respect to shot 2 within the overlapped areas and the adjacent areas.

Positions on the mask 2 corresponding to pixels selected as those having shot 1 as their exposure shot within the overlapped areas are of course not exposed because of the formation of the light-shielding pattern. In the same manner, positions on the mask 1 corresponding to pixels selected as those having shot 2 as their exposure shot are not exposed because of the formation of the light-shielding pattern. However, since shot 1 and shot 2 are randomly placed within the overlapped areas, there is a case in which selected pixels 46 for shot 2 surround a selected pixel 45 for shot 1, or a case in which selected pixels 45 for shot 1 surround a selected pixel 46 for shot 2.

In such a case, if a duplicate exposure area is not provided between the light-shielding pattern of the mask 1 and the light-shielding pattern of the mask 2, there is a possibility that unnecessary patterns are formed between shot 1 exposed by using the mask 1 and shot 2 exposed by using the mask 2 or loss of necessary patterns occurs, due to differences in the finishing precision of the mask 1 and the mask 2 or due to fine offsets of the positions of shot 1 and shot 2 occurring on the array substrate upon exposure. For this reason, the light-shielding pattern 47 of the mask 1 and the light-shielding pattern 48 of the mask 2 are designed to have duplicate exposure areas of 1 to 5 μm that are formed mutually overlapped manner at their adjacent areas; thus, it becomes possible to prevent the formation of unnecessary patterns and loss of necessary patterns.

Figure 6:
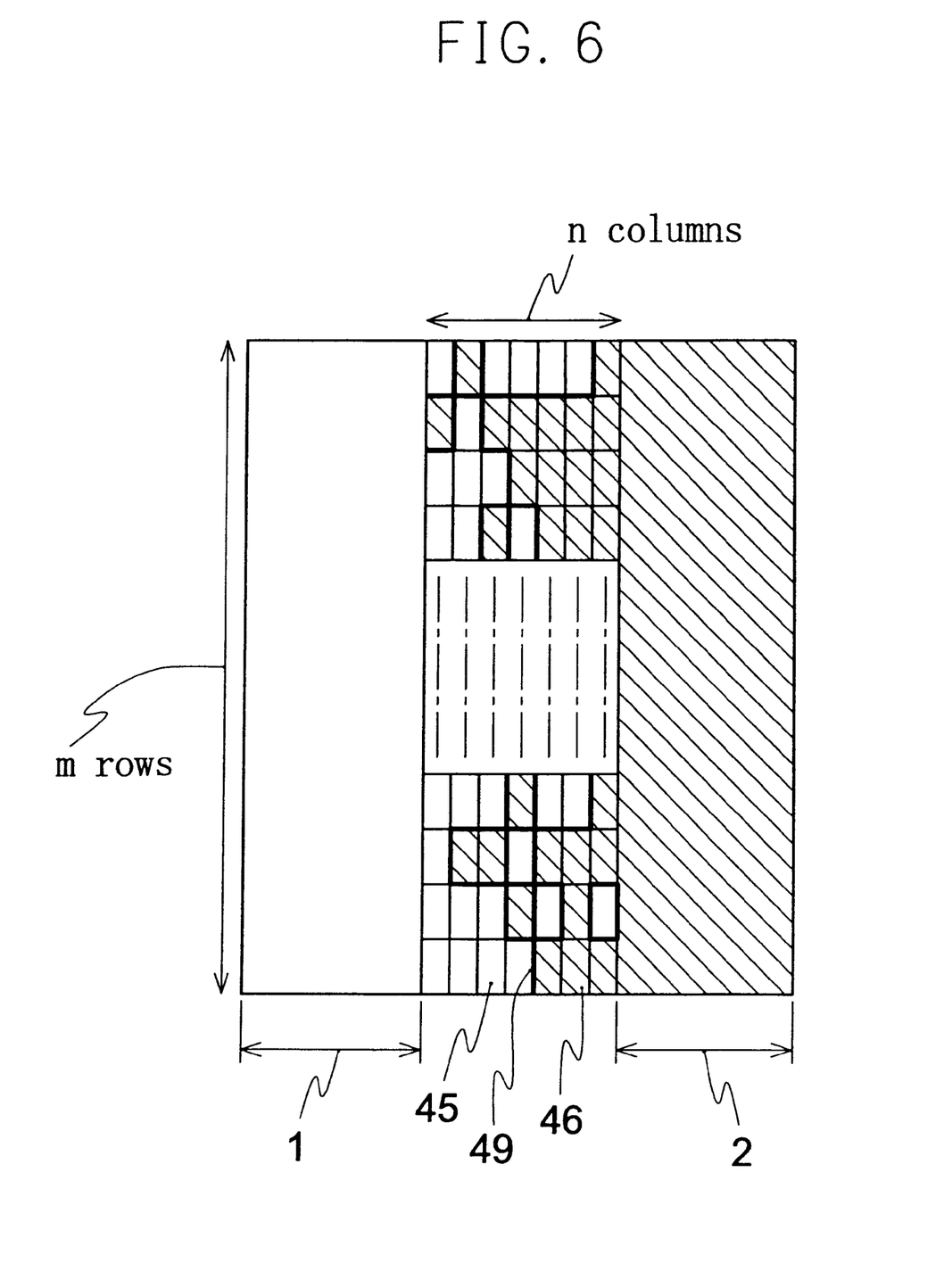
FIG. 6 is a schematic plan view showing the duplicate exposure areas in FIG. 3.

The duplicate exposure areas of the mask 1 and the mask 2 are indicated by bold lines 49 in FIG. 6. The duplicate exposure areas 49 indicated by the bold lines are subjected to duplicated exposure by shot 1 and shot 2; therefore, the same pattern is of course prepared in the mask 1 and the mask 2 with respect to those areas to be exposed.

Embodiment 2

In the above-mentioned embodiment 1, an explanation was given to the setting of the overlapped areas with respect to the adjacent shots in the lateral direction, and the same as embodiment 1 is true in the setting of the overlapped areas adjacent in the longitudinal direction on the plane.

In this case, overlapped areas between shot 1 and shot 2 adjacent to each other in the longitudinal direction are constituted by m rows and n columns by using a pixel size as one unit. Here, it is preferable to set the width of the overlapped area greater than 4 mm so as to allow the visibility to become vague.

Figure 7:
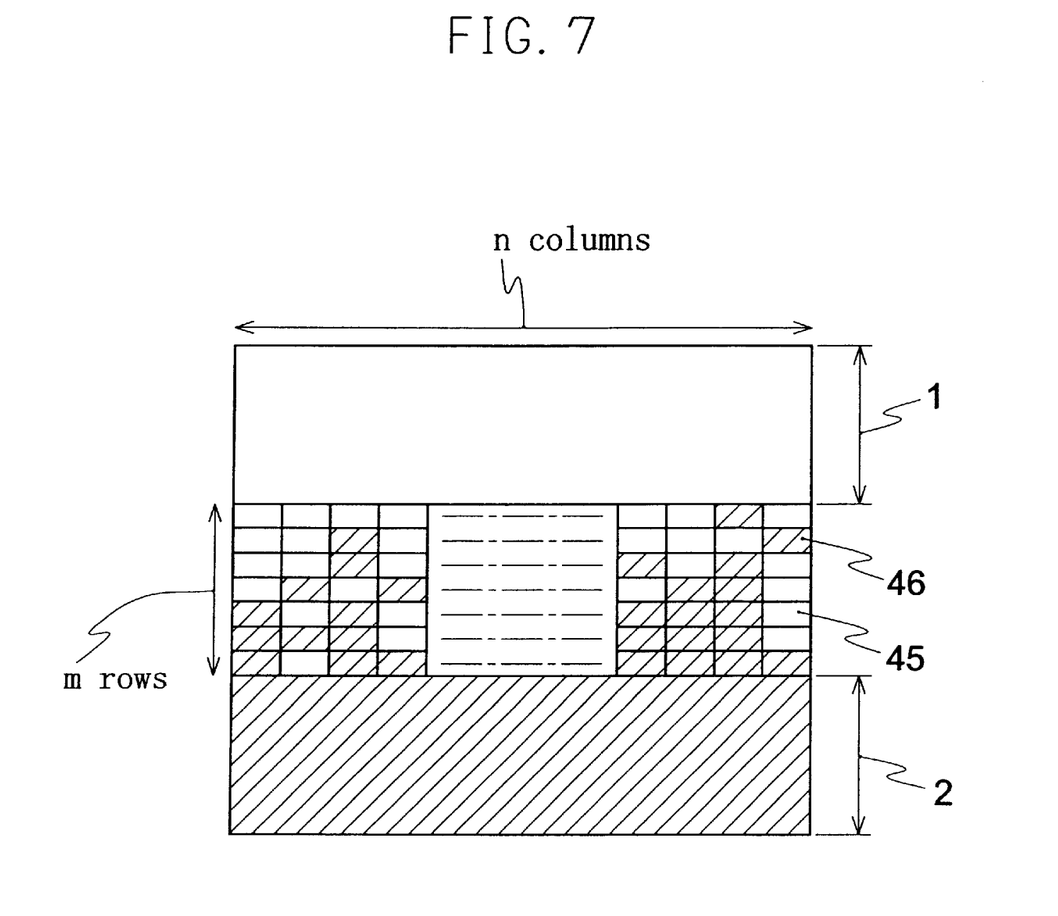
FIG. 7 is a schematic plan view showing the shot layout of a TFT array substrate related to one step in accordance with EMBODIMENT 2.

FIG. 7 shows a schematic view of an array-substrate shot layout of one step in embodiment 2. In FIG. 7, reference numeral 1 shows an area to be exposed only by shot 1, and reference numeral 2 shows an area to be exposed only by shot 2. Reference numeral 45 shows areas that are to be exposed by shot 1 within the overlapped areas, and reference numeral 46 shows areas that are to be exposed by shot 2 within the overlapped areas. With respect to the shot layout within the overlapped areas of m rows and n columns, as a portion in question comes closer to area 1 to be exposed only by shot 1, it contains more selected pixels 45 to be exposed by shot 1, and these are placed by using random numbers. For example, in a row adjacent to area 1 to be exposed only by shot 1 within the overlapped areas, pixels the number of which is represented by an integer (Nm) closest to n×m/(m+1) are selected as the pixels 45 that are to be exposed by shot 1. In a row adjacent thereto, the number is represented by integer (Nm-1) closest to n×(m-1)/(m+1), and so on; thus, the number of the pixels 45 to be exposed by shot 1 is successively reduced, and in a row adjacent to area 2 that is to be exposed only by shot 2, pixels the number of which is represented by an integer (N1) closest to n×1/(m+1) are selected as those to be exposed by shot 1. In the reversed manner, in the row closest to area 1 within the overlapped areas that is to be exposed only by shot 1, the number of pixels 46 that are to be exposed by shot 2 is represented by n−Nm, and as a portion in question comes closer to area 2 to be exposed only by shot 2, the number is increased, and in the row closest to area 2 to be exposed only by shot 2, the number is represented by n−N1. (The same sentences as embodiment 1 follow.)

Embodiment 3

In large-size liquid crystal display apparatuses which have been recently demanded, in the case when the display area is formed by using the division exposing system, the exposing operation is seldom carried out by using repeated processes in the lateral or longitudinal direction, and in most cases, the exposing operation is carried out by using two-dimensional combinations in the lateral and longitudinal directions. Such combinations can be achieved by combining embodiment 1 and embodiment 2; however, it is also necessary to take it into account the quadruple overlapped areas in the lateral and longitudinal directions.

Figure 8:
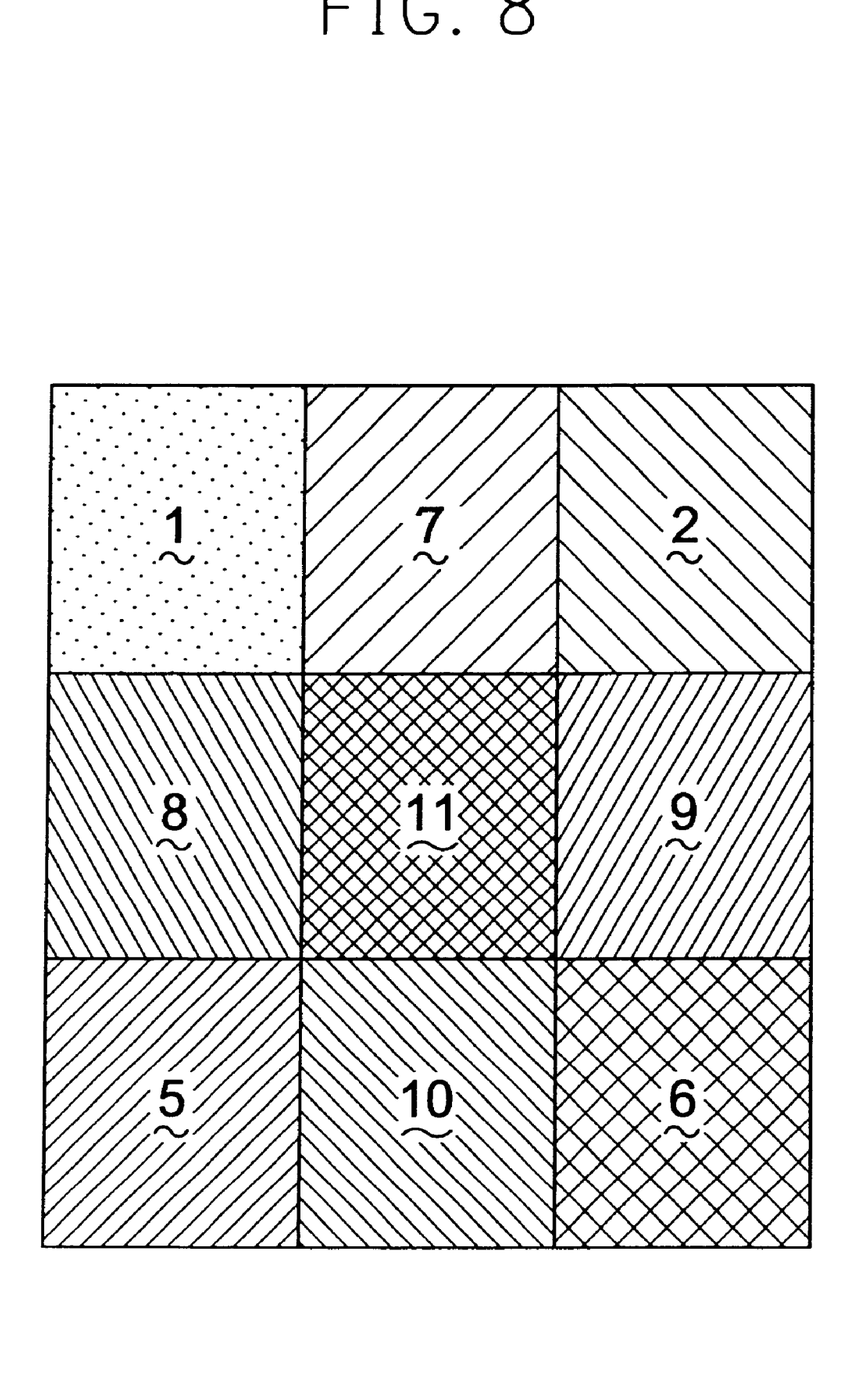
FIG. 8 is a schematic plan view showing a case in which shots are placed adjacent to one another in the lateral and longitudinal directions.

FIG. 8 is a schematic plan view that shows a case in which shots are placed adjacent to one another in the lateral and longitudinal directions. In FIG. 8, reference numeral 1 shows an area to be exposed only by shot 1, reference numeral 2 shows an area to be exposed only by shot 2, reference numeral 5 shows an area to be exposed only by shot 3 and reference numeral 6 shows an area to be exposed only by shot 4. Reference numeral 7 shows an overlapped area by shot 1 and shot 2, and reference numeral 10 shows an overlapped area by shot 3 and shot 4. With respect to the areas 7 and 10, embodiment 1 can be applied. In the same manner, reference numeral 8 shows an overlapped area by shot 1 and shot 3, and reference numeral 9 shows an overlapped area by shot 2 and shot 4. With respect to the areas 8 and 9, embodiment 2 can be applied. Here, reference numeral 11 shows a quadruple overlapped area by shot 1, shot 2, shot 3 and shot 4, and with respect to this area, either embodiment 1 or embodiment 2 can be applied. However, by combining embodiment 1 and embodiment 2, the overlapped areas may be arranged by using random numbers so that the number of pixels to be selected varies in accordance with the distance from each shot and the quadruple overlapped state in the lateral and longitudinal directions. It is more effective to combine embodiment 1 and embodiment 2 than to apply either embodiment 1 or embodiment 2 with respect to these areas, since parameters for the display characteristics are allowed to reflect information of the adjacent four shots more effectively, and become more complex; thus, the visibility is made further vague.

Figure 9:
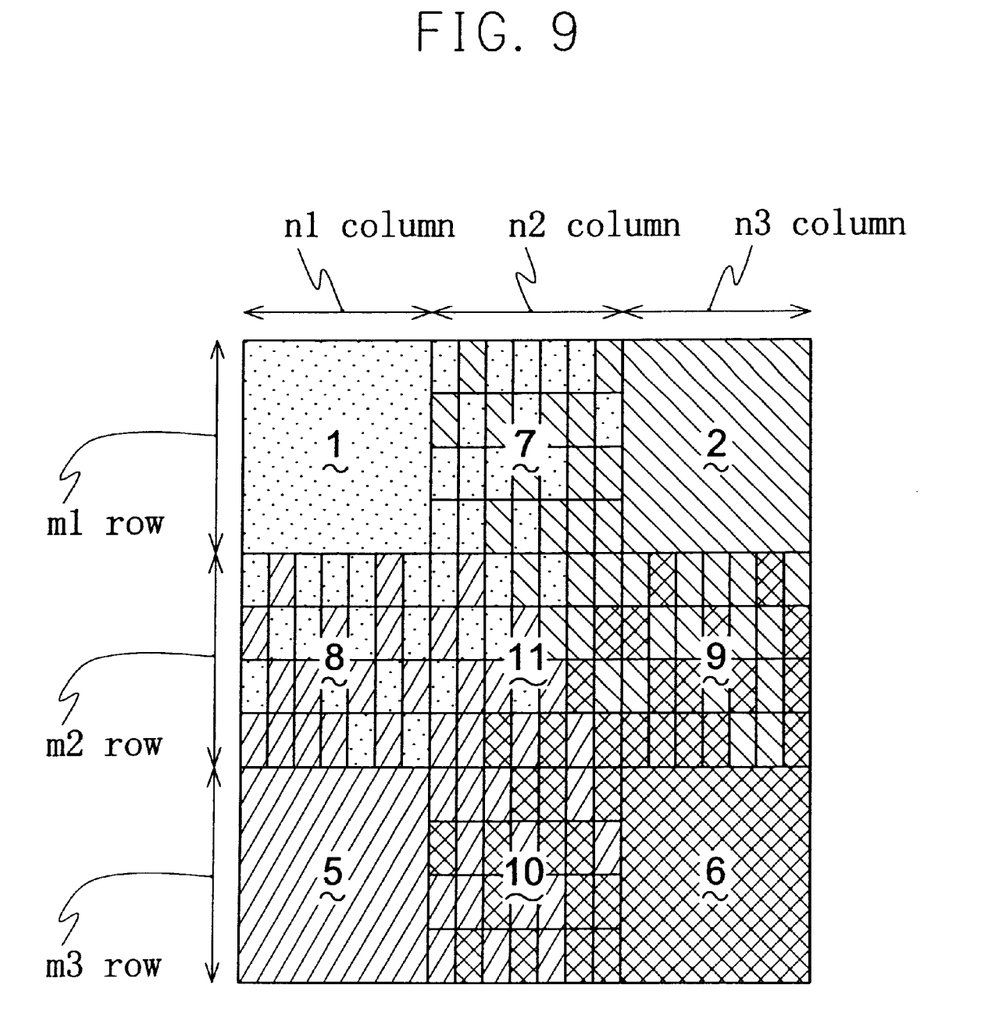
FIG. 9 is schematic plan view showing the shot layout of a TFT array substrate related to one step in accordance with EMBODIMENT 3.

The above-mentioned method is shown in FIG. 9 as embodiment 3. The following description will discuss the selection method of shots within the quadruple overlapped areas. First, with respect to pixels within the overlapped areas, those respectively belong to right and left shots and upper and lower shots are selected by successively applying embodiment 1 and embodiment 2 in a separate manner. In other words, pixels in the overlapped areas are selected as those belonging to left shot or right shot and as those belonging to upper shot or lower shot in an overlapping manner. Next, based on the selections on upper and lower shots as well as left and right shots, respective pixels are classified. In other words, those pixels belonging to left shot and upper shot are exposed by shot 1, and those pixels belonging to left shot and lower shot are exposed by shot 3. In the same manner, those pixels belonging to right shot and upper shot are exposed by shot 2, and those pixels belonging to right shot and lower shot are exposed by shot 4. With respect to the areas in which light-shielding patterns of the different shots are located adjacent to one another, the setting of the multiple-exposure areas is also made in the same manner as embodiment 1 and embodiment 2. Therefore, taking it into consideration the case in which shots 1, 2, 3, and 4 are located adjacent to one another, multiple-exposure areas having maximum quadruple overlaps are provided.

Moreover, the following method is proposed so as to determine the ratio of each of the four kinds of shots within a quadruple overlapped area 11. For example, the ratio of shot 2 is set to values in the range of 0 to 0.5 in proportion to the distance from the border (diagonally lower left) of the quadruple overlapped area to the area of shot 2. With respect to all other shots 1, 3, and 4, the same setting is made; thus, at any point on the overlapped areas, the sum of the ratios of four kinds of the shots is represented by one, with the result that the probability of a certain shot increases linearly as a position in question comes closer to the area of the corresponding shot. A specific example is shown as follows: Here, it is supposed that the quadruple overlapped area is standardized as a square with one side represented by 1 and its lower left apex defined as the original. When probabilities P1 through P4 of shots 1, 2, 3 and 4 within the area are found at a position indicated by coordinates (0.75, 0.75), P1=2/8, P2=3/8, P3=1/8 and P4=2/8 are obtained. By carrying out random processes based upon the combinations of these values of probability, it is possible to determine shots to be actually selected.

Embodiment 4

The following description will discuss embodiment 4 in which embodiment 1, embodiment 2 and embodiment 3 are applied to a pixel electrode formation process. When the present invention is applied to the pixel electrode formation process, it is possible to obtain effects for suppressing the shot-to-shot difference in electric characteristics due to a parasitic capacitor Cds between the drain electrode and source electrode and also for suppressing the shot-to-shot difference in the occurrence of domains due to the oriented state of the liquid crystal. Moreover, in the case when an auxiliary capacitor is formed between the pixel electrode formation process and another process such as a scanning line formation process, it is possible to obtain an effect for making the dispersions in the auxiliary capacitor less conspicuous.

Embodiment 5

The following description will discuss embodiment 5 in which embodiment 1, embodiment 2 and embodiment 3 are applied to a scanning line formation process. When the present invention is applied to the scanning-line formation process, it is possible to obtain effects for suppressing the shot-to-shot difference in electric characteristics due to a parasitic capacitor Cgd between the gate electrode and drain electrode. Moreover, in the case when an auxiliary capacitor is formed between the scanning-line formation process and another process such as a pixel electrode formation process, it is possible to obtain an effect for making the dispersions in the auxiliary capacitor less conspicuous. Moreover, in the case when a common wiring system is adopted as the formation method of the auxiliary capacitor, it is possible to obtain effects for suppressing the shot-to-shot difference in electric characteristics due to a parasitic capacitor between the common auxiliary capacitor wiring and the source wiring. Furthermore, in the case when a black matrix pattern in an electrically floating state is formed in the scanning line formation process, it is possible to obtain effects for suppressing the shot-to-shot difference in electric characteristics due to a parasitic capacitor Cds between the drain electrode and source electrode (line).

In addition, in the case when the scanning line formation process also serves as a black matrix pattern formation process on the array substrate, it is possible to obtain effects for suppressing fluctuations in the aperture ratio.

Embodiment 6

The following description will discuss sixth embodiment in which embodiment 1, embodiment 2 and embodiment 3 are applied to a data line formation process. When the present invention is applied to the data line formation process, it is possible to obtain effects for suppressing the shot-to-shot difference in electric characteristics due to a parasitic capacitor Cgd between the gate electrode and drain electrode. It is also possible to obtain effects for suppressing the shot-to-shot difference in electric characteristics due to a parasitic capacitor Cds between the source electrode (line) and the drain electrode.

Embodiment 7

The following description will discuss embodiment 7 in which embodiment 1, embodiment 2 and embodiment 3 are applied to two processes selected from a scanning line formation process, a data line formation process, a channel formation process and a pixel electrode formation process, in a combined manner, and with respect to the shot selection method within the overlapped areas, the layout of the two processes is made based upon the same random-number layout. As compared with the one applied process, parameters become more complex, and it is possible to allow the visibility on the border to become further vague.

Figure 10:
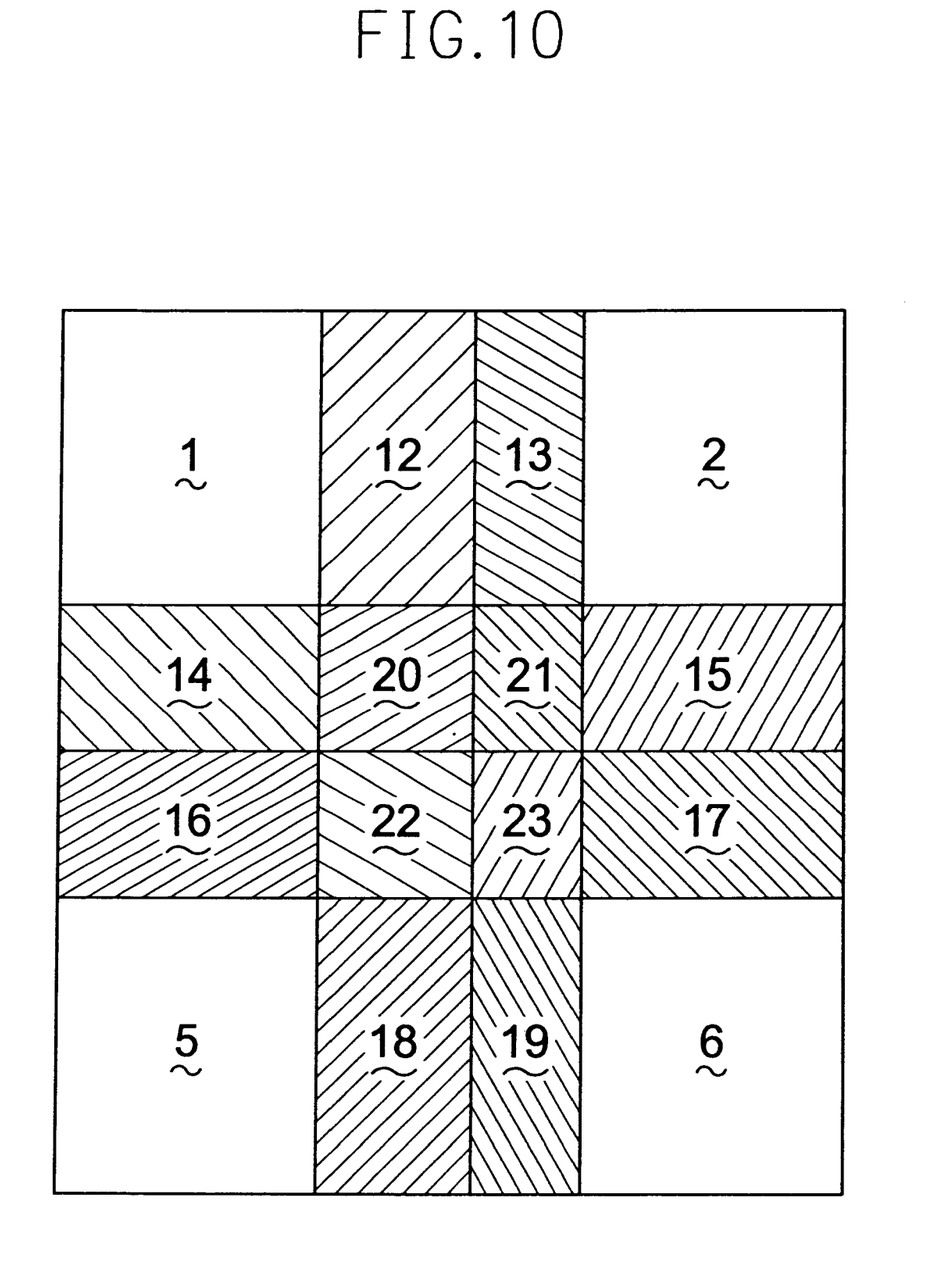
FIG. 10 is a schematic plan view showing the shot layout of a TFT array substrate related to one step in accordance with EMBODIMENT 7.

FIG. 10 is a schematic drawing that shows the shot layout on the array substrate of embodiment 7.

In FIG. 10, reference numeral 1 shows an area in which exposure is made by using only shot 1 in all the processes; reference numeral 2 shows an area in which exposure is made by using only shot 2 in all the processes; reference numeral 5 shows an area in which exposure is made by using only shot 3 in all the processes; and reference numeral 6 is an area in which exposure is made by using only shot 4 in all the processes. Reference numeral 12 shows an area in which the other processes are subjected to exposure by shot 1, and the two processes to which the present invention is applied are subjected to exposure made by either shot 1 or shot 2, and the selected shots are placed based upon the same random-number layout in the two applied processes; reference numeral 13 shows an area in which the other processes are subjected to exposure by shot 2 and the two processes to which the present invention is applied are subjected to exposure by shot 1 or shot 2, and the selected shots are placed based upon the same random-number layout in the two applied processes; reference numeral 14 shows an area in which the other processes are subjected to exposure by shot 1, and the two processes to which the present invention is applied are subjected to exposure made by either shot 1 or shot 3, and the selected shots are placed based upon the same random-number layout in the two applied processes; reference numeral 15 shows an area in which the other processes are subjected to exposure by shot 2, and the two processes to which the present invention is applied are subjected to exposure made by either shot 2 or shot 4, and the selected shots are placed based upon the same random-number layout. in the two applied processes; reference numeral 16 shows an area in which the other processes are subjected to exposure by shot 3, and the two processes to which the present invention is applied are subjected to exposure made by either shot 1 or shot 3, and the selected shots are placed based upon the same random-number layout in the two applied processes; reference numeral 17 shows an area in which the other processes are subjected to exposure by shot 4, and the two processes to which the present invention is applied are subjected to exposure made by either shot 2 or shot 4, and the selected shots are placed based upon the same random-number layout in the two applied processes; reference numeral 18 shows an area in which the other processes are subjected to exposure by shot 3, and the two processes to which the present invention is applied are subjected to exposure made by either shot 3 or shot 4, and the selected shots are placed based upon the same random-number layout in the two applied processes; and reference numeral 19 shows an area in which the other processes are subjected to exposure by shot 4, and the two processes to which the present invention is applied are subjected to exposure made by either shot 3 or shot 4, and the selected shots are placed based upon the same random-number layout in the two applied processes. Reference numeral 20 shows an area in which the other processes are subjected to shot 1, and the two processes to which the present invention is applied is subjected to exposure made by either, shot 1, shot 2, shot 3 or shot 4, and the selected shots are placed based upon the same random-number layout in the two applied processes; reference numeral 21 shows an area in which the other processes are subjected to shot 2, and the two processes to which the present invention is applied is subjected to exposure made by either, shot 1, shot 2, shot 3 or shot 4, and the selected shots are placed based upon the same random-number layout in the two applied processes; reference numeral 22 shows an area in which the other processes are subjected to shot 3, and the two processes to which the present invention is applied is subjected to exposure made by either, shot 1, shot 2, shot 3 or shot 4, and the selected shots are placed based upon the same random-number layout in the two applied processes; and reference numeral 23 shows an area in which the other processes are subjected to shot 4, and the two processes to which the present invention is applied is subjected to exposure made by either, shot 1, shot 2, shot 3 or shot 4, and the selected shots are placed based upon the same random-number layout in the two applied processes.

The effects obtained by the above combined processes are considered to be the combinations of effects shown in embodiment 5, embodiment 6 and embodiment 7.

Embodiment 8

The following description will discuss embodiment 8 in which embodiment 1, embodiment 2 and embodiment 3 are applied to two processes selected from a scanning line formation process, a data line formation process, a channel formation process and a pixel electrode formation process, in a combined manner, and with respect to the shot selection method within the overlapped areas, the layouts of the two processes are independently made based upon respective random-number layouts. As compared with the case of the same shot layout of the two selected processes, the number of combinations of shots within the overlapped areas further increases and parameters become even more complex, and it is possible to allow the visibility on the border to become further vague.

The schematic drawing of the shot layout on the array substrate is the same as FIG. 6, and in FIG. 10, reference numeral 1 shows an area in which exposure is made by using only shot 1 in all the processes; reference numeral 2 shows an area in which exposure is made by using only shot 2 in all the processes; reference numeral 5 shows an area in which exposure is made by using only shot 3 in all the processes; and reference numeral 6 is an area in which exposure is made by using only shot 4 in all the processes. Reference numeral 12 shows an area in which the other processes are subjected to exposure by shot 1, and the two processes to which the present invention is applied are subjected to exposure made by either shot 1 or shot 2, and the selected shots are independently placed based upon respective random-number layouts in the two applied processes; reference numeral 13 shows an area in which the other processes are subjected to exposure by shot 2 and the two processes to which the present invention is applied are subjected to exposure by shot 1 or shot 2, and the selected shots are independently placed based upon respective random-number layouts in the two applied processes; reference numeral 14 shows an area in which the other processes are subjected to exposure by shot 1, and the two processes to which the present invention is applied are subjected to exposure made by either shot 1 or shot 3, and the selected shots are independently placed based upon respective random-number layouts in the two applied processes; reference numeral 15 shows an area in which the other processes are subjected to exposure by shot 2, and the two processes to which the present invention is applied are subjected to exposure made by either shot 2 or shot 4, and the selected shots are independently placed based upon respective random-number layouts in the two applied processes; reference numeral 16 shows an area in which the other processes are subjected to exposure by shot 3, and the two processes to which the present invention is applied are subjected to exposure made by either shot 1 or shot 3, and the selected shots are independently placed based upon respective random-number layouts in the two applied processes; reference numeral 17 shows an area in which the other processes are subjected to exposure by shot 4, and the two processes to which the present invention is applied are subjected to exposure made by either shot 2 or shot 4, and the selected shots are placed based upon respective random-number layouts in the two applied processes; reference numeral 18 shows an area in which the other processes are subjected to exposure by shot 3, and the two processes to which the present invention is applied are subjected to exposure made by either shot 3 or shot 4, and the selected shots are independently placed based upon respective random-number layouts in the two applied processes; and reference numeral 19 shows an area in which the other processes are subjected to exposure by shot 4, and the two processes to which the present invention is applied are subjected to exposure made by either shot 3 or shot 4, and the selected shots are independently placed based upon respective random-number layouts in the two applied processes. Reference numeral 20 shows an area in which the other processes are subjected to shot 1, and the two processes to which the present invention is applied is subjected to exposure made by either, shot 1, shot 2, shot 3 or shot 4, and the selected shots are independently placed based upon respective random-number layouts in the two applied processes; reference numeral 21 shows an area in which the other processes are subjected to shot 2, and the two processes to which the present invention is applied is subjected to exposure made by either, shot 1, shot 2, shot 3 or shot 4, and the selected shots are placed independently based upon respective random-number layouts in the two applied processes; reference numeral 22 shows an area in which the other processes are subjected to shot 3, and the two processes to which the present invention is applied is subjected to exposure made by either, shot 1, shot 2, shot 3 or shot 4, and the selected shots are independently placed based upon respective random-number layouts in the two applied processes; and reference numeral 23 shows an area in which the other processes are subjected to shot 4, and the two processes to which the present invention is applied is subjected to exposure made by either, shot 1, shot 2, shot 3 or shot 4, and the selected shots are independently placed based upon respective random-number layouts in the two applied processes. The effects obtained by the above combined processes are considered to be the combinations of effects shown in embodiment 5, embodiment 6 and embodiment 7.

Embodiment 9

The following description will discuss embodiment 9 in which embodiment 1, embodiment 2 and embodiment 3 are applied to not less than three processes selected from a scanning line formation process, a data line formation process, a channel formation process and a pixel electrode formation process, in a combined manner, and with respect to the shot selection method within the overlapped areas, the layouts of the processes are made based upon the same random-number layouts in all the processes. As the number of the applied processes increases, parameters become even more complex, and it is possible to allow the visibility on the border to become further vague. Moreover, the effects obtained by the above combined processes are considered to be the combinations of effects shown in embodiment 5, embodiment 6 and embodiment 7.

Embodiment 10

The following description will discuss embodiment 10 in which embodiment 1, embodiment 2 and embodiment 3 are applied to not less than three processes selected from a scanning line formation process, a data line formation process, a channel formation process and a pixel electrode formation process, in a combined manner, and with respect to the shot selection method within the overlapped areas, the layouts of the processes are independently made based upon respective random-number layouts in the selected processes. As compared with the case in which the same shot layout is used in the selected three processes, the number of the shot combinations within the overlapped areas further increases, parameters become even more complex, and it is possible to allow the visibility on the border to become further vague. Moreover, the effects obtained by the above combined processes are considered to be the combinations of effects shown in embodiment 5, embodiment 6 and embodiment 7.

Additionally, the above-mentioned embodiments have dealt with the exposure process on the TFT array substrate as an example; however, the present invention may be adopted so as to eliminate factors causing unevenness in luminance on the counter substrate, and the same effects can be obtained.

In accordance with the manufacturing method of a liquid crystal display apparatus of claims 1 through 10 of the present invention, in a liquid crystal display apparatus including:

(1) a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and (2) a counter substrate provided with a liquid crystal interposed between the TFT array substrate and the counter substrate;

wherein a divisional exposing method is adopted as a patterning method on the TFT array substrate, adjacent exposing areas within a display area of the liquid crystal display apparatus have overlapped portions with each other being divided into a plurality shots, and a shot layout is defined in such a manner that, within the overlapped exposing areas; the portion which comes closer to a specific shot area is subjected to a greater distribution of the predetermined shot. Therefore, even when the division exposure method is adopted, it is possible to provide a liquid crystal display apparatus which allows unevenness in luminance in the vicinity of border lines in the divided areas to become less conspicuous.

In accordance with the manufacturing method of a liquid crystal display apparatus of claim 7 of the present invention, it is possible to provide a liquid crystal display apparatus which prevents the formation of unnecessary patterns and loss of necessary patterns in the borders between different shots within the above-mentioned overlapped areas.

In accordance with a liquid crystal display apparatus of claims 11 of the present invention, the apparatus is manufactured by the method of claim 1.

What is claimed is:

1. Method for manufacturing a liquid crystal display apparatus comprising:

forming a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and providing a counter substrate opposing said TFT array substrate with a liquid crystal interposed between the TFT array substrate and the counter substrate;

wherein said step of forming a TFT substrate comprises:
using a divisional exposing method as a patterning method on the TFT array substrate to form adjacent exposing areas within a display area of the liquid crystal display apparatus,
causing said adjacent exposing areas to overlap in an overlapped area that is divided into a plurality of shots, and
providing a shot layout within the overlapped exposing area such that a portion of the overlapped exposing area which comes closer to a predetermined exposing area is subjected to a linearly greater distribution of a predetermined shot associated with the predetermined exposing area.

2. The method of claim 1, wherein within the overlapped.

3. The method of claim 1, wherein within the overlapped exposing areas, the shot is randomly selected.

4. The method of claim 1, wherein within the overlapped exposing area, the number of shots occupied by the predetermined shot is selected in proportion to the distance from the predetermined exposing area an adjacent exposing area of a different shot.

5. The method of claim 1, wherein the overlapped exposing areas have a width greater than 4 mm.

6. The method of claim 1, wherein within the overlapped exposing areas, a shot adjacent to a different shot includes a multi-exposure area of 1 to 5 $\mu$m.

7. The method of claim 1, wherein the method is applied as a patterning method to any one of the steps of forming the scanning-line, forming the semiconductor-layer, forming the data-line and forming the pixel-electrode.

8. The method of claim 1, wherein the method is applied to a plurality of steps among the steps of forming the scanning-line, forming the semiconductor-layer, forming the data-line formation and forming the pixel-electrode, wherein the same shot layout is used within the overlapped areas among the above-mentioned applied steps.

9. The method of claim 1, wherein the method is applied to a plurality of steps among the steps of forming the scanning-line, forming the semiconductor-layer, forming the data-line and forming the pixel-electrode, wherein individually independent shot layouts are used within the overlapped exposing areas among the above-mentioned applied steps.

10. Method for manufacturing a liquid crystal display apparatus comprising:

forming a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and providing a counter substrate opposing said TFT array substrate with a liquid crystal interposed between the TFT array substrate and the counter substrate;

wherein said step of forming a TFT substrate comprises:
using a divisional exposing method as a patterning method on the TFT array substrate to form adjacent exposing areas within a display area of the liquid crystal display apparatus, causing said adjacent exposing areas to overlap in a quadruple overlap exposing area that is divided into a plurality of shots, and providing a shot layout within the quadruple overlapped exposing area such that a portion of the quadruple overlapped exposing area which comes closer to a predetermined exposing area is subjected to a greater distribution of a predetermined shot associated with the predetermined exposing area.

11. A liquid crystal display apparatus manufactured by the method for manufacturing a liquid crystal display apparatus comprising:

a TFT array substrate having a plurality of scanning lines formed on a transparent insulating substrate by a metal film, a plurality of data lines formed on or beneath the scanning lines so as to be separated by an insulating film in such a manner as to intersect the scanning lines, switching elements that are formed by a semiconductor layer at respective intersections between the scanning lines and the data lines, and pixel electrodes that are formed by a transparent conductive film and electrically connected to the switching elements; and a counter substrate provided with a liquid crystal interposed between the TFT array substrate and the counter substrate;

wherein said step of forming a TFT substrate comprises:
using a divisional exposing method as a patterning method on the TFT array substrate to form adjacent exposing areas within a display area of the liquid crystal display apparatus, causing said adjacent exposing areas to overlap in an overlapped area that is divided into a plurality of shots, and providing a shot layout within the overlapped exposing area such that a portion of the overlapped exposing area which comes closer to a predetermined exposing area is subjected to a greater distribution of a predetermined shot associated with the predetermined exposing area.

* * * * *